US007258806B1

(12) United States Patent
Ho

(10) Patent No.: US 7,258,806 B1
(45) Date of Patent: Aug. 21, 2007

(54) METHOD OF FABRICATING A DIAPHRAGM OF A CAPACITIVE MICROPHONE DEVICE

(75) Inventor: Hsien-Lung Ho, Taipei County (TW)

(73) Assignee: Touch Micro-System Technology Inc., Yang-Moi, Taoyuan Hsien (TW)

( * ) Notice: Subject to any disclaimer, the term of this patent is extended or adjusted under 35 U.S.C. 154(b) by 0 days.

(21) Appl. No.: 11/426,017

(22) Filed: Jun. 23, 2006

(30) Foreign Application Priority Data

Apr. 10, 2006 (TW) ............................... 95112674 A

(51) Int. Cl.
*C23F 1/00* (2006.01)
*H01L 21/00* (2006.01)

(52) U.S. Cl. ............................................ 216/2; 438/53

(58) Field of Classification Search .................... 216/2; 438/53; 73/754, 724, 715, 718; 381/174
See application file for complete search history.

(56) References Cited

U.S. PATENT DOCUMENTS 4,670,969 A * 6/1987 Yamada et al. ............... 438/53
5,068,203 A * 11/1991 Logsdon et al. .............. 438/53
5,332,469 A * 7/1994 Mastrangelo .................. 216/2
5,484,745 A * 1/1996 Cahill ......................... 438/53
5,589,810 A * 12/1996 Fung ............................ 338/4
5,632,854 A * 5/1997 Mirza et al. .................. 438/53
5,888,412 A * 3/1999 Sooriakumar et al. ........ 216/41
5,888,845 A * 3/1999 Bashir et al. ................. 438/53
6,365,055 B1 * 4/2002 Weber et al. .................. 216/2

* cited by examiner

*Primary Examiner*—Parviz Hassanzadeh
*Assistant Examiner*—Roberts Culbert
(74) *Attorney, Agent, or Firm*—Winston Hsu

(57) ABSTRACT

A method of fabricating a diaphragm of a capacitive microphone device. First, a substrate is provided, and a dielectric layer on a first surface of the substrate is formed. Than, a plurality of silicon spacers are formed on a surface of the dielectric layer, and a diaphragm layer is formed on a surface of the silicon spacers and the surface of the dielectric layer. Subsequently, a planarization layer is formed on the diaphragm layer, and a second surface of the substrate is etched to form a plurality of openings corresponding to the diaphragm layer disposed on the surface of the dielectric layer. Thereafter, the dielectric layer exposed through the openings is removed, and planarization layer is removed.

9 Claims, 9 Drawing Sheets

METHOD OF FABRICATING A DIAPHRAGM OF A CAPACITIVE MICROPHONE DEVICE

BACKGROUND OF THE INVENTION

1. Field of the Invention

The present invention relates to a method of fabricating a diaphragm of a capacitive microphone device, and more particularly, to a method of fabricating a diaphragm of a capacitive microphone device that has silicon spacers.

2. Description of the Prior Art

Capacitive microphone device has a parallel capacitor composed of a diaphragm and back plate. When the diaphragm senses a sound pressure and vibrates, the capacitance between the diaphragm and the back plate will change. Generally speaking, the capacitive microphone device can be classified into two types: electret type and condenser type. For a capacitive microphone device, the diaphragm is used to sense the sound pressure, and therefore requires good uniformity to accurately reflect the volume and frequency of sound.

The diaphragm of a conventional capacitive microphone device is made of plastic, and formed by stamping. The plastic diaphragm is mounted on the back plate by spacers. However, the plastic diaphragm formed by stamping has poor yield and uniformity. In addition, the conventional method, which assembles the diaphragm with spacers after the capacitive microphone device, requires high cost and much cycle time.

SUMMARY OF THE INVENTION

It is therefore one of the objectives of the present invention to provide a method of fabricating a diaphragm of a capacitive microphone device to improve the uniformity and reliability.

According to the present invention, a method of fabricating a diaphragm of a capacitive microphone device is provided. First, a substrate is provided, and a dielectric layer on a first surface of the substrate is formed. Than, a plurality of silicon spacers are formed on a surface of the dielectric layer, and a diaphragm layer is formed on a surface of the silicon spacers and the surface of the dielectric layer. Subsequently, a planarization layer is formed on the diaphragm layer, and a second surface of the substrate is etched to form a plurality of openings corresponding to the diaphragm layer disposed on the surface of the dielectric layer. Thereafter, the dielectric layer exposed through the openings is removed, and the planarization layer is removed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
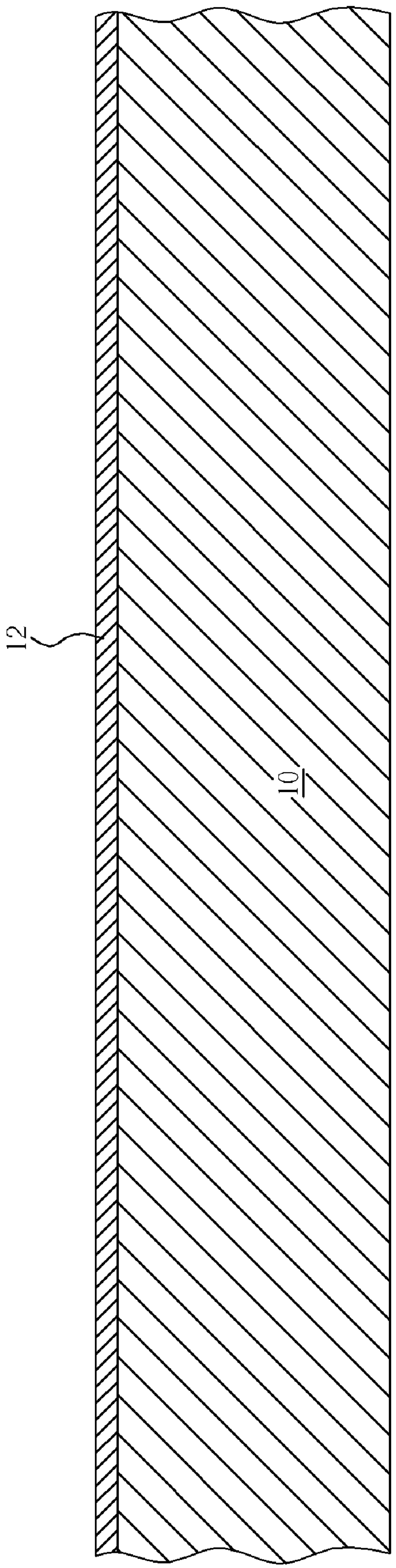
FIG. 1 to FIG. 9 are schematic diagrams illustrating a method of fabricating a diaphragm of a capacitive microphone device according to a preferred embodiment of the present invention.

Please refer to FIG. 1 to FIG. 9. FIG. 1 to FIG. 9 are schematic diagrams illustrating a method of fabricating a diaphragm of a capacitive microphone device according to a preferred embodiment of the present invention. As shown in FIG. 1, a substrate 10 e.g. a semiconductor wafer is provided. Subsequently, a dielectric layer 12 is formed on a first surface of the substrate 10. In this embodiment, a 4-micrometer thick silicon oxide layer is used as the material of the dielectric layer 12.

Figure 2:
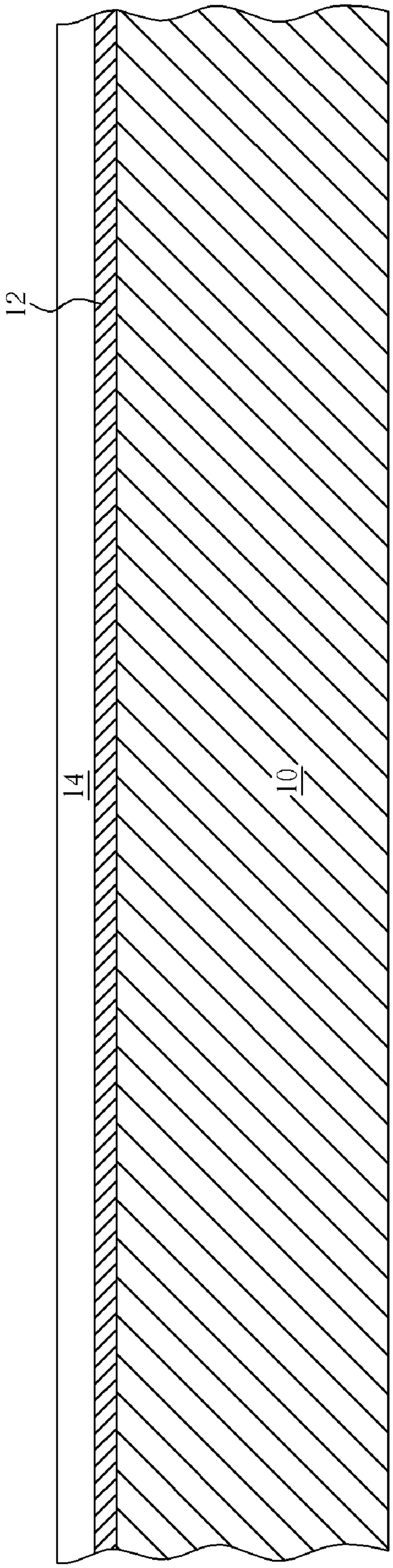
Figure 3:
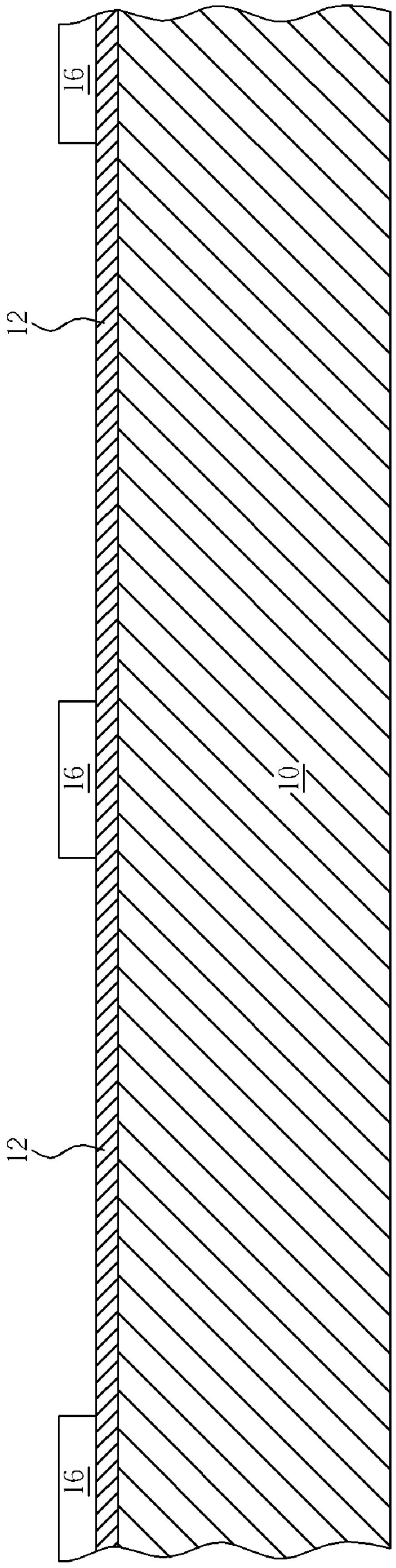

As shown in FIG. 2, a silicon layer 14 is formed on the surface of the dielectric layer 12. In this embodiment, the silicon layer 14 is a deposited polycrystalline silicon layer, and the thickness of the silicon layer 14 is approximately 10 micrometers. In addition, the stress of the silicon layer 14 is controlled to less than 10 MPa. It is appreciated that the silicon layer 14 can be made of other materials such as amorphous crystalline silicon or single crystalline silicon, and the thickness may be modified if necessary. As shown in FIG. 3, a portion of the silicon layer 14 is removed by e.g. lithography and etching techniques to form a plurality of silicon spacers 16. Please note that each silicon spacer 16 has a vertical sidewall, so as to ensure the diaphragm to be formed having good uniformity.

Figure 4:
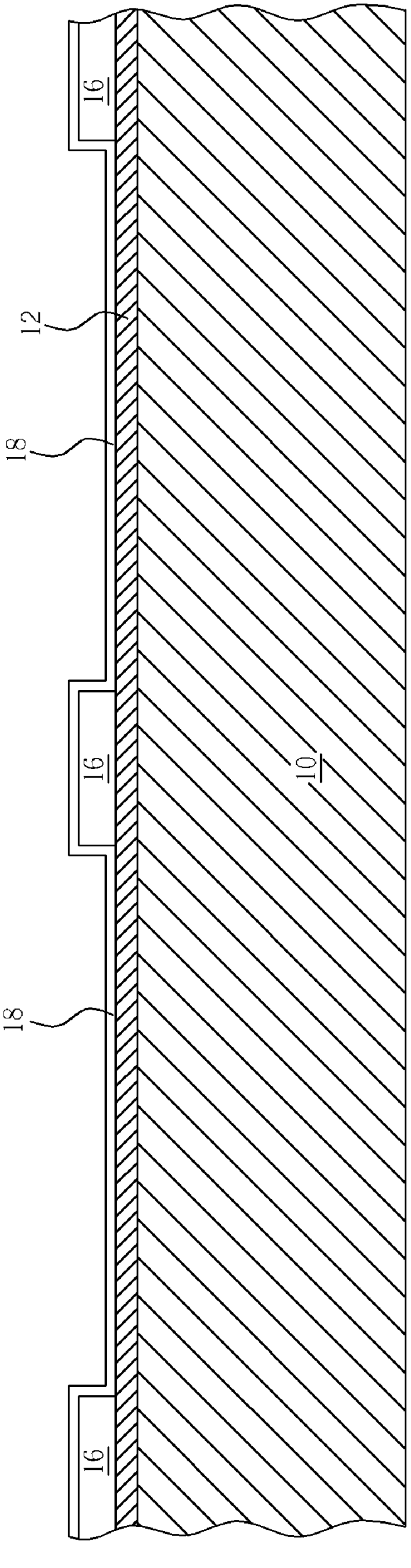

As shown in FIG. 4, a diaphragm layer 18 is formed on the surface of the dielectric layer 12 and the silicon spacers 16. In this embodiment, the diaphragm layer 18 is a deposited polycrystalline silicon layer having a thickness of 0.5 micrometer, and the stress is controlled less than 10 MPa. It is appreciated that the diaphragm layer 18 can be made of other materials such as amorphous crystalline silicon or single crystalline silicon, and the thickness may be modified if necessary.

Figure 5:
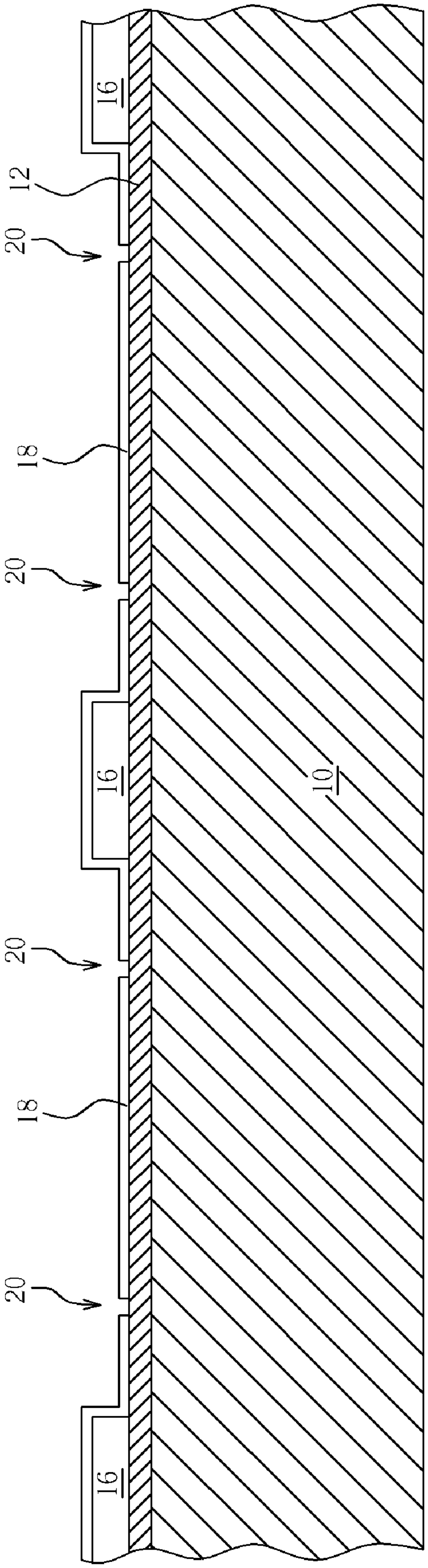

As shown in FIG. 5, a plurality of vents 20 can be optionally formed by e.g. lithography and etching techniques in the diaphragm layer 18. The vents 20 can prevent noises resulting from the damping effect while sensing sound signals. It is appreciated that the vents 20 can also be formed in a back plate (not shown), rather than in the diaphragm layer 18.

Figure 6:
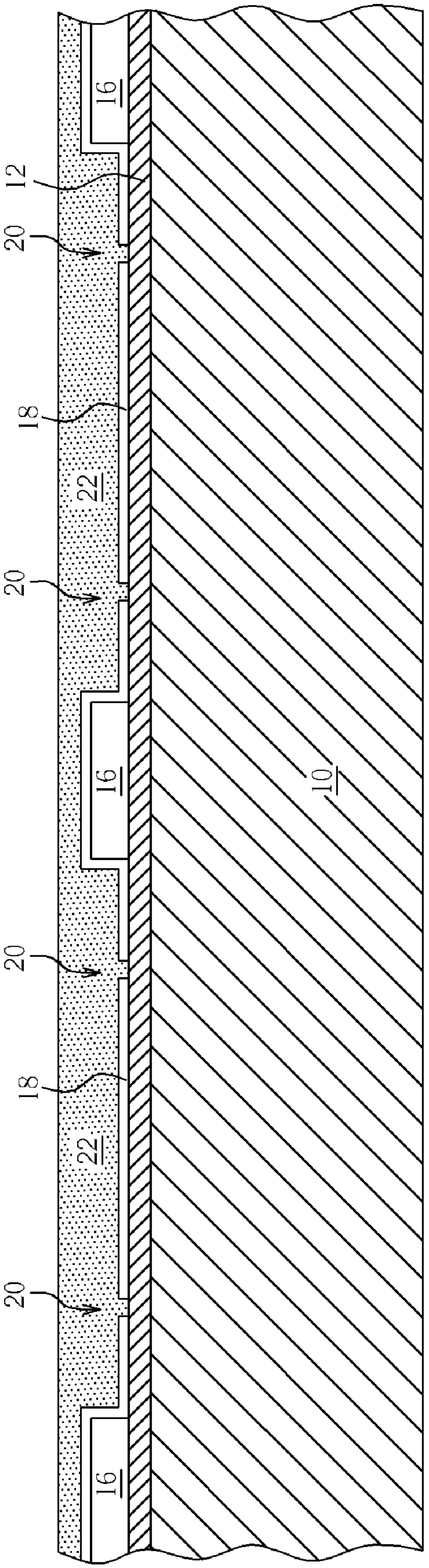
Figure 7:
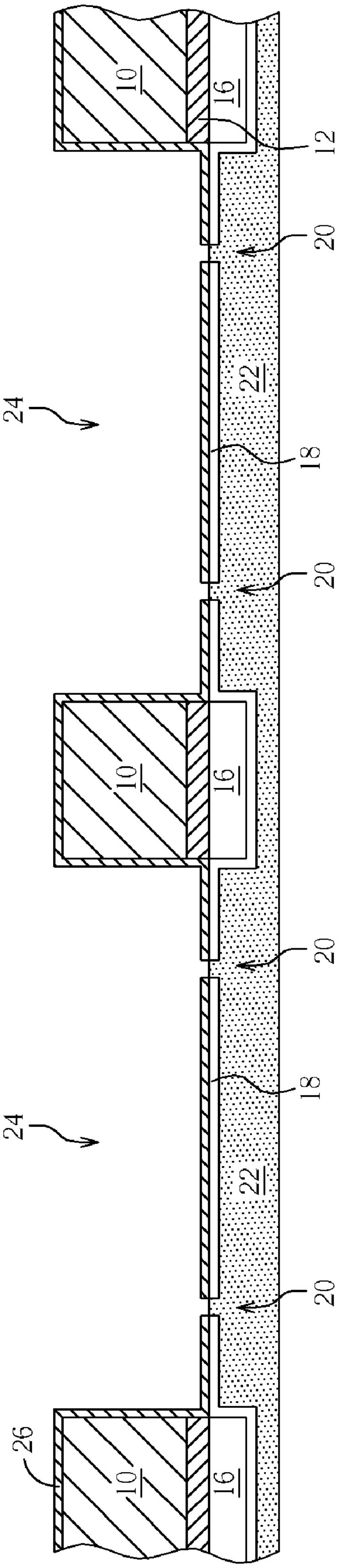

As shown in FIG. 6, a planarization layer 22 such as a photoresist layer is formed on the diaphragm layer 18 for the convenience of successive processes. As shown in FIG. 7, the substrate 10 is turned over, and a thinning process can be selectively performed from a second surface of the substrate 10 depending on the initial thickness of the substrate 10. The thinning process can be implemented by e.g. polishing, grinding, etching, etc. Subsequently, a plurality of openings 24 corresponding to the diaphragm layer 18 disposed on the surface of the dielectric layer 12 are formed on the second surface of the substrate 10 by lithography and etching techniques. Then, the dielectric layer 12 exposed through the openings 24 is etched. Thereafter, a metal layer 26, which serves as an electrode, is formed on the second surface of the substrate 10 and on the surface of the diaphragm layer 18. In this embodiment, the metal layer 26 is a titanium/gold layer formed by electroplating, and has a thickness of between 1000 and 2000 angstroms. However, the material of the metal layer 26 is not limited. In addition, the electrode can be incorporated into the diaphragm layer 18 if the diaphragm layer 18 turns conductive. For instance, the diaphragm layer 18 can be doped to turn conductive.

Figure 8:
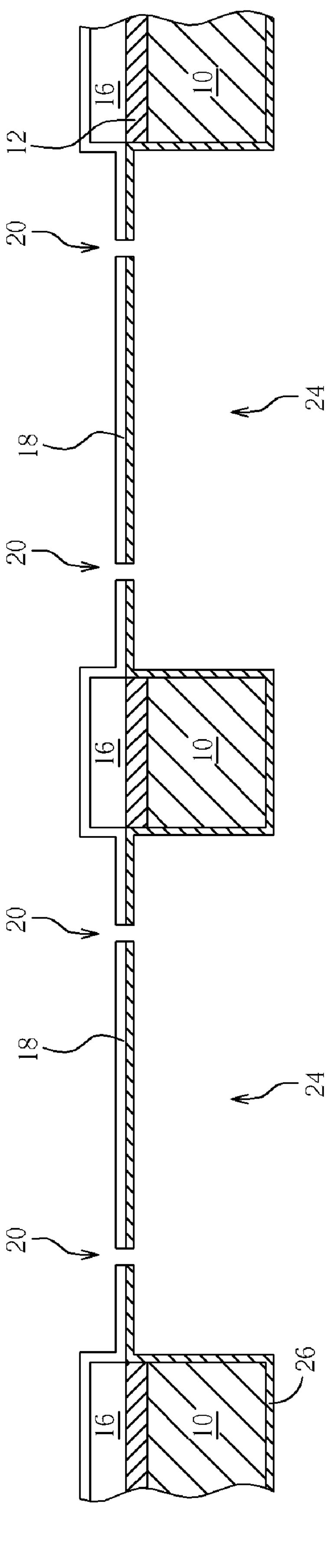
Figure 9:
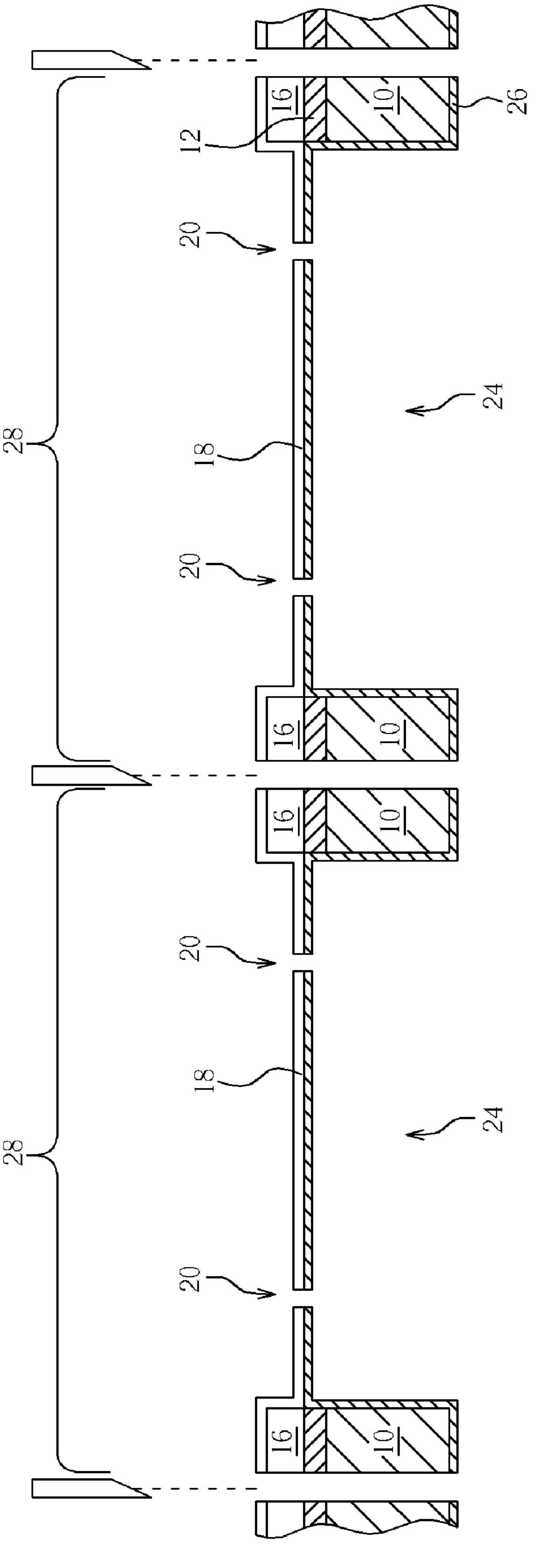

As shown in FIG. 8, the substrate 10 is turned over again, and the planarization layer 22 disposed on the first surface of the substrate 10 and the surface of the diaphragm layer 18 is removed. As shown in FIG. 9, a segment process e.g. a cutting process or an etching process is performed to cut or etch the substrate 10 along scribe lines formed in advance to form a plurality of diaphragm structures 28.

The diaphragm structure can be combined with a back plate having a stationary electrode, and therefore forms a capacitive microphone device. It is appreciated that the diaphragm structure can be applied to various capacitive microphone devices such as electret type microphone device or condenser type microphone device. In addition, the method of the invention can be modified to be a wafer-level method if the substrate having the diaphragm layer is bonded to another substrate having stationary electrodes prior to performing the segment process.

In summary, the method of the invention uses silicon as the material of spacers, and therefore can fabricate diaphragms with high uniformity and high reliability. In addition, the thickness of the diaphragm can be thinner than that of a conventional plastic diaphragm, and thus has broader applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a diaphragm of a capacitive microphone device, comprising:

providing a substrate, and forming a dielectric layer on a first surface of the substrate;

forming a plurality of silicon spacers on a surface of the dielectric layer;

forming a diaphragm layer on a surface of the silicon spacers and the surface of the dielectric layer;

forming a planarization layer on the diaphragm layer, and etching a second surface of the substrate to form a plurality of openings corresponding to the diaphragm layer disposed on the surface of the dielectric layer;

removing the dielectric layer exposed through the openings; and removing the planarization layer.

2. The method of claim 1, wherein the dielectric layer comprises a silicon oxide layer.

3. The method of claim 1, wherein forming the silicon spacers comprises:

depositing a silicon layer on the surface of the dielectric layer; and etching a portion of the silicon layer and stopping etching at the dielectric layer to form the silicon spacers;

wherein each of the silicon spacers has a vertical sidewall.

4. The method of claim 3, wherein the silicon layer comprises a polycrystalline silicon layer, an amorphous crystalline silicon layer, or a single crystalline silicon layer.

5. The method of claim 1, wherein the diaphragm layer comprises a polycrystalline silicon layer, an amorphous crystalline silicon layer, or a single crystalline silicon layer.

6. The method of claim 1, further comprising forming a plurality of vents in the diaphragm layer subsequent to forming the diaphragm layer.

7. The method of claim 1, further comprising performing a thinning process on the second surface of the substrate prior to forming the openings.

8. The method of claim 1, further comprising forming a metal layer on the surface of the diaphragm layer subsequent to removing the dielectric layer exposed through the openings.

9. The method of claim 8, further comprising segmenting the substrate to form a plurality of diaphragm structures subsequent to forming the metal layer.

* * * * *

UNITED STATES PATENT AND TRADEMARK OFFICE

CERTIFICATE OF CORRECTION

PATENT NO. : 7,258,806 B1
APPLICATION NO. : 11/426017
DATED : August 21, 2007
INVENTOR(S) : Hsien-Lung Ho It is certified that error appears in the above-identified patent and that said Letters Patent is hereby corrected as shown below:

On the title page item(73), correct the residence of the assignee from “Yang-Moi” to --Yang-Mei--.

Signed and Sealed this

Twentieth Day of November, 2007

JON W. DUDAS
*Director of the United States Patent and Trademark Office*